(12) United States Patent
Sato

(10) Patent No.: US 12,301,217 B2
(45) Date of Patent: May 13, 2025

(54) COMMON GATE DRIVE CIRCUIT FOR SWITCHING HIGH VOLTAGE DEVICE

(71) Applicant: RENESAS ELECTRONICS AMERICA INC., Milpitas, CA (US)

(72) Inventor: Tetsuo Sato, San Jose (CA)

(73) Assignee: RENESAS ELECTRONICS AMERICA INC., Milpitas, CA (US)

( * ) Notice: Subject to any disclaimer, the term of this patent is extended or adjusted under 35 U.S.C. 154(b) by 173 days.

(21) Appl. No.: 18/064,340

(22) Filed: Dec. 12, 2022

(65) Prior Publication Data

US 2024/0195401 A1 Jun. 13, 2024

(51) Int. Cl.
 *H03K 17/082* (2006.01)
 *H03K 17/042* (2006.01)
 *H02M 1/08* (2006.01)

(52) U.S. Cl.
 CPC ......... *H03K 17/04206* (2013.01); *H02M 1/08* (2013.01); *H03K 17/0822* (2013.01)

(58) Field of Classification Search
 CPC .............. H02M 1/08; H03K 17/04206; H03K 17/0822
 USPC .................................. 327/108, 109, 110, 111
 See application file for complete search history.

(56) References Cited

U.S. PATENT DOCUMENTS

| | | | | |
|---|---|---|---|---|
| 6,563,343 B1* | 5/2003 | Patel | .................. | H03K 19/0027 326/87 |
| 2010/0283439 A1* | 11/2010 | Singh | ................... | H03K 17/102 327/108 |
| 2011/0148368 A1* | 6/2011 | Burns | ................... | H02M 1/088 323/225 |
| 2015/0280701 A1* | 10/2015 | Park | ................... | H03K 17/6872 327/379 |
| 2016/0172961 A1* | 6/2016 | Deng | ................... | H02M 3/158 327/109 |
| 2020/0195245 A1* | 6/2020 | Randolph | ............ | H03K 17/163 |
| 2020/0195246 A1* | 6/2020 | Randolph | ........ | H03K 17/04123 |

* cited by examiner

*Primary Examiner* — William Hernandez
(74) *Attorney, Agent, or Firm* — SCULLY, SCOTT, MURPHY & PRESSER, P.C.

(57) ABSTRACT

Semiconductor devices for driving transistors in a power device are described. A semiconductor device can include a voltage source configured to provide a fixed bias voltage to a first device implemented as a common gate device. The semiconductor device can further include a second device connected in series with the first device. The current output of the second device can be connected to a source terminal of the first device. The semiconductor device can further include a driver configured to drive the second device to perform current control on the first device.

18 Claims, 9 Drawing Sheets

COMMON GATE DRIVE CIRCUIT FOR SWITCHING HIGH VOLTAGE DEVICE

BACKGROUND OF THE SPECIFICATION

The present disclosure relates in general to semiconductor devices. More specifically, the present disclosure relates to a drive circuit for driving transistors in power devices.

DC-to-DC voltage conversion may be performed by switching voltage regulators or power converters to convert a voltage from one voltage level to another voltage level that may be required by a load. A switching voltage regulator can use, for example, two power transistors to convert energy from one voltage to another voltage. Each power transistor can be driven by a drive circuit that can be a semiconductor device including a driver and other components that generates gate voltage to switch a power transistor on and off. The two power transistors can be switched on and off alternately, and the switching speed can affect an efficiency of the voltage regulator. In an aspect, different types of drive circuit (e.g., drive circuit having different components) can be used for driving power transistors different band gap.

SUMMARY

In one embodiment, a semiconductor devices for driving transistors in a power device is generally described. The semiconductor device can include a voltage source configured to provide a fixed bias voltage to a first device implemented as a common gate device. The semiconductor device can further include a second device connected in series with the first device. The current output of the second device can be connected to a source terminal of the first device. The semiconductor device can further include a driver configured to drive the second device to perform current control on the first device.

In one embodiment, a semiconductor devices for driving transistors in a power device is generally described. The semiconductor device can include a first device that operates as a common gate device. The semiconductor device can further include a driver integrated circuit (IC). The driver IC can include a voltage source configured to provide a fixed bias voltage to a first device implemented as a common gate device. The driver IC can further include a second device connected in series with the first device. The current output of the second device can be connected to a source terminal of the first device. The driver IC can further include a driver configured to drive the second device to perform current control on the first device.

In one embodiment, an apparatus for driving transistors in a power device is generally described. The apparatus can include a controller configured to output a pulse width modulation (PWM) signal. The apparatus can further include a power converter. The power converter can include a first device that operates as a common gate device. The power converter can further include a driver integrated circuit (IC). The driver IC can include a voltage source configured to provide a fixed bias voltage to a first device implemented as a common gate device. The driver IC can further include a second device connected in series with the first device. The current output of the second device can be connected to a source terminal of the first device. The driver IC can further include a driver configured to use the PWM signal to drive the second device to perform current control on the first device.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

Figure 1A:
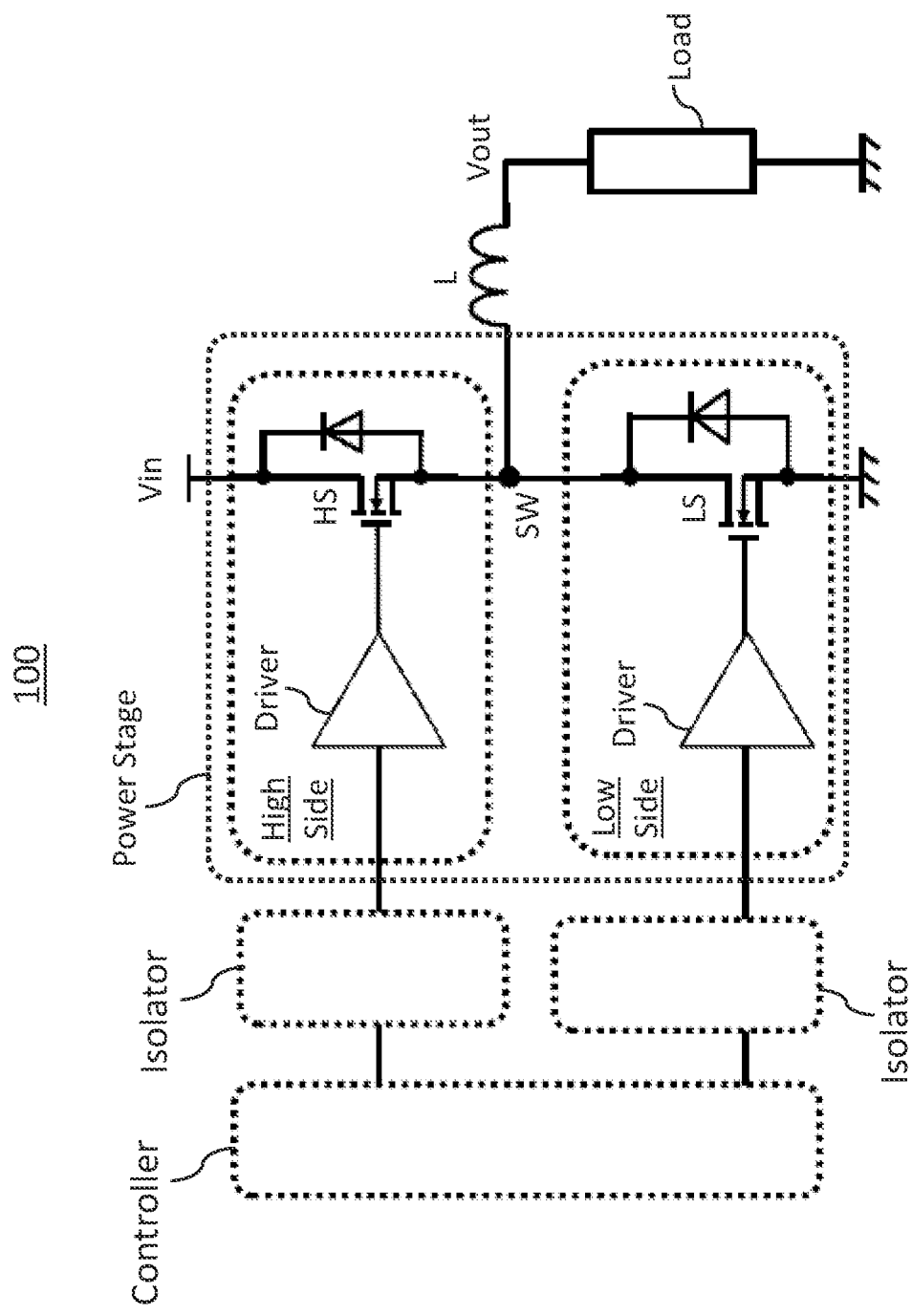
FIG. 1A is a diagram showing a conventional system implementing a half-bridge circuit.

FIG. 1A is a diagram showing a conventional system implementing a half-bridge circuit. A conventional system 100 shown in FIG. 1A can be an apparatus implementing a voltage regulator including a controller and at least one voltage regulators or power stages. The controller can be a master controller, or a multiphase controller, and the power stage can include a half-bridge buck converter. The half-bridge converter can include a high side channel and a low side channel. The high side portion can include a driver configured to drive a high side device or transistor labeled as device HS. The low side portion can include a driver configured to drive a low side device or transistor labeled as device LS. The controller can be configured to control the power stage using a pulse width modulation (PWM) signal. The PWM signal provided by the controller can switch devices HS, LS to convert an input voltage Vin into an output voltage Vout. A load can be connected to a switch node SW between devices HS, LS and the load can receiver power produced by Vout via an inductor L. In an aspect, one or more output capacitors (not shown) can be connected between inductor L and the load.

To operate system 100, devices HS, LS can be switched on alternately, and devices HS, LS cannot be switched on simultaneously. An increase in switching speed can reduce sizes of the output inductor L and capacitor, thus reduce weight and cost, but high switching speed can also increase a risk of having devices HS, LS being switched on at the same time. If devices HS, LS are high voltage devices, then higher switching speed may be required, and conventional common source drive circuit may be insufficient to handle the high voltage swing and high switching speed required by these high voltage devices. In an aspect, high voltage devices can be devices with relatively wide band gap and high gate threshold voltage, thus may require higher voltage to be switched on. Hence, the drivers may need to operate at faster switching speeds to accommodate the higher voltage required to switch on high voltage devices.

Figure 1B:
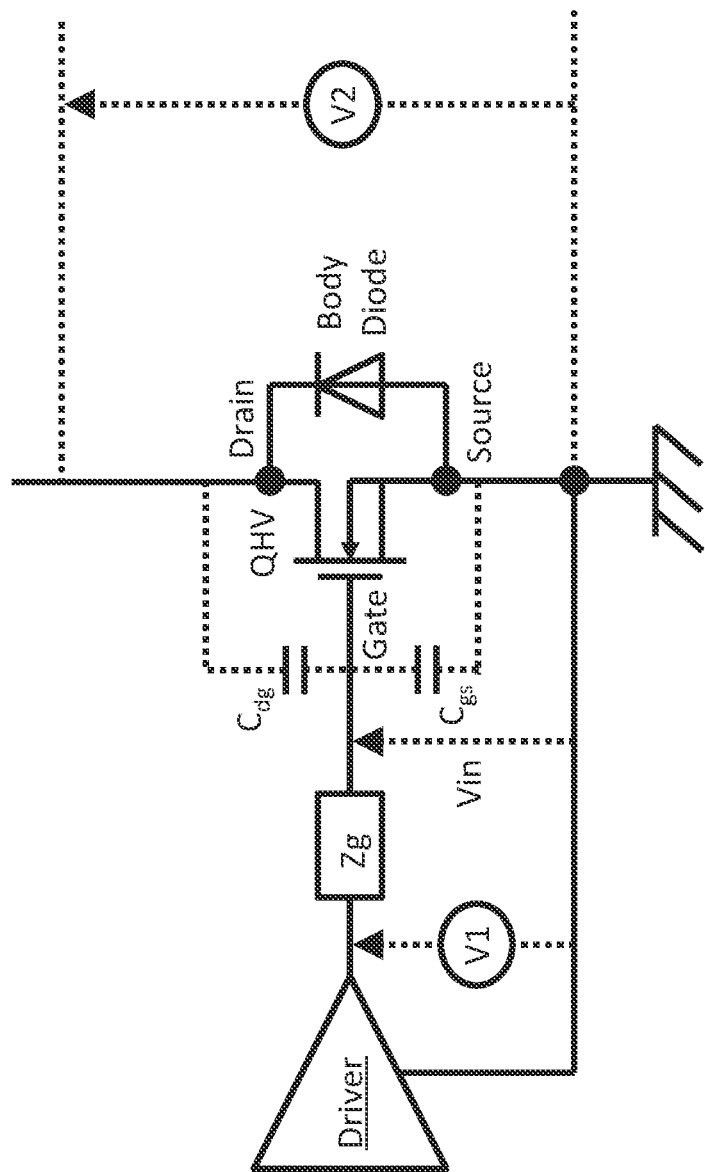
FIG. 1B is a diagram showing a conventional drive circuit for switching a device.

FIG. 1B is a diagram showing a conventional drive circuit for switching a device. A conventional drive circuit 101 shown is shown in FIG. 1B, where the conventional drive circuit can be a common source drive circuit including a driver configured to drive a high voltage device or transistor labeled as QHV. Device QHV shown in FIG. 1B is being implemented as a low side device (e.g., device LS in FIG. 1A), but drive circuit 101 can be applicable for driving a high side device (e.g., device HS in FIG. 1A) as well.

In an aspect, devices (e.g., transistors) that are considered as high voltage and high switching speed can include, for example, silicon carbide junction-based field-effect transistors (SiC JFET), high voltage metal-oxide-semiconductors (HV MOS), super junction MOS (SJ MOS), silicon carbide MOS (SiC MOS), gallium nitride high electron mobility transistors (GaN HEMT). Such high voltage and high switching devices can have relatively larger or wider band gap, higher gate threshold voltage. Using common source driving to drive high voltage devices can present challenges related to drain to gate capacitance (Cdg) feedback such as, for example, power on shoot through, negative bias source for deep cut-off and high speed switching.

Conventional solutions to address these challenges can include, for example, gate clamp function, sequential power on control, dual voltage source for driver, high power gate drive to absorb mirror current injection. However, these solutions may require components that can be costly and that can occupy circuit board space. For example, solutions that utilizes gate clamp function may require addition of a clamp circuit.

Further, in the configuration shown in FIG. 1B, the drain of device QHV can be relatively sensitive. This high sensitivity can be stabilized by limiting the drain-source voltage across the device QHV. Since QHV is a high voltage device, this limit can prevent the device QHV to operate at its full potential. Also, due to QHV being a high voltage device, a voltage swing V2 can be relatively high, and this high voltage swing feedback to Vin by Cdg, can increase ringing and parasitic oscillation in the case.

Figure 2:
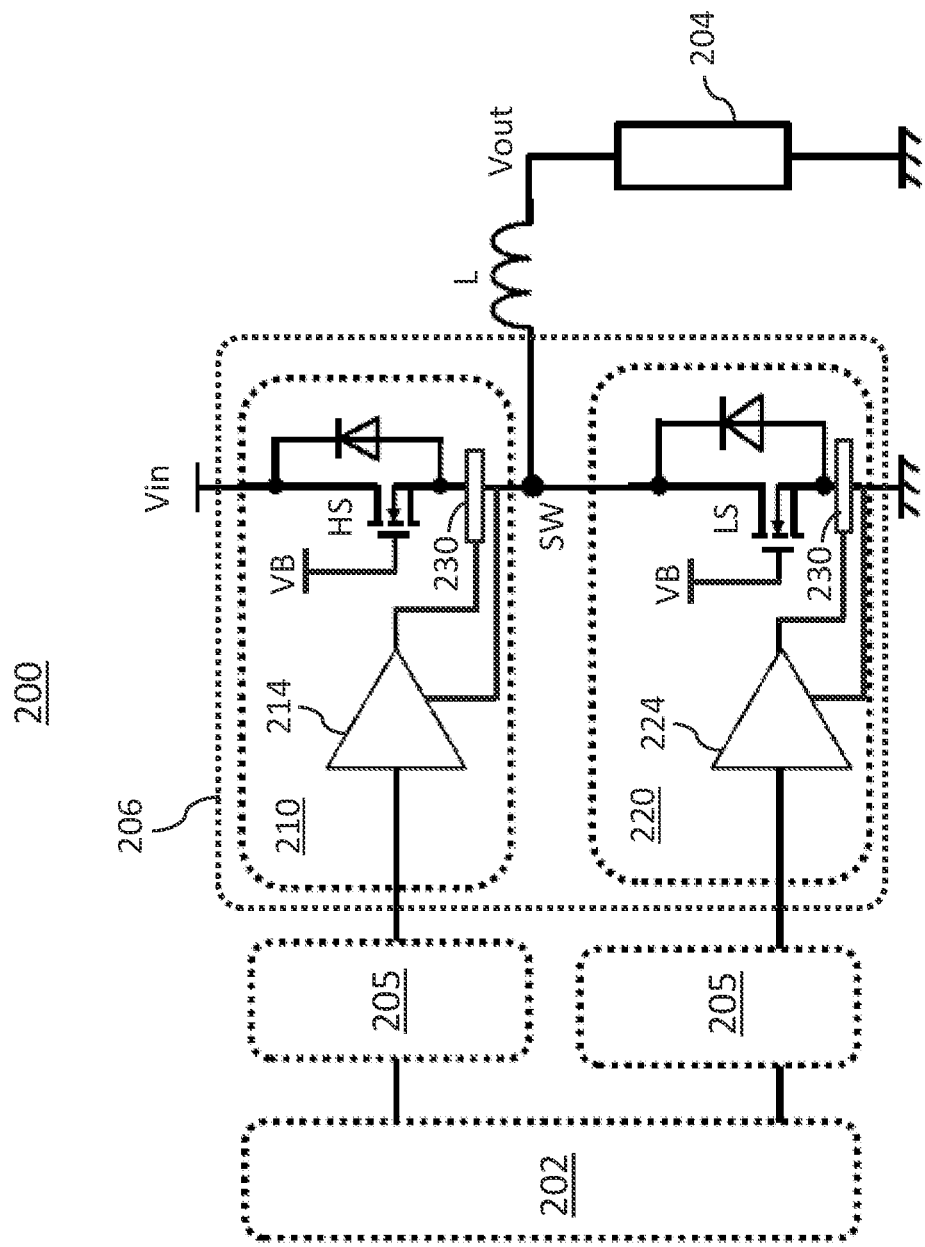
FIG. 2 is a diagram showing a device that can implement common gate drive circuit for switching high voltage device in one embodiment.

FIG. 2 is a diagram showing a device that can implement common gate drive circuit for switching high voltage device in one embodiment. A device 200 shown in FIG. 2 can be an apparatus implementing a voltage regulator including a controller 202 and at least one voltage regulators or power stages, such as a power stage 206. In an example, controller 202 may be a master controller, or a multiphase controller, and power stage 206 can include a DC-DC converter. Controller 202 can be configured to control power stage 206 using a pulse width modulation (PWM) signal. Power stage 206 can include a pair of power devices or transistors, including a high-side device or transistor (labeled as HS in FIG. 2) and a low-side device or transistor (labeled as LS in FIG. 2), that forms a half-bridge buck converter. Devices HS, LS can be high electron mobility transistors (HEMT), field-effect-transistors (JFET) or metal-oxide-semiconductor field-effect-transistors (MOSFET). The PWM signal provided by controller 202 can switch devices HS, LS convert an input voltage Vin into an output voltage Vout. A load 204 can be connected to a switch node SW between devices HS, LS and load 204 can receiver power produced by Vout via an inductor L. In an aspect, one or more output capacitors (not shown) can be connected between inductor L and load 204.

Power stage 206 can include a high-side channel 210 and a low-side channel 220. An isolator 205 can be connected between controller 202 and high-side channel 210, and a copy of isolator 205 can be connected between controller 202 and low-side channel 220. Isolator 205 can be configured to transfer signals from controller 202 to a connected driver (e.g., driver 214 or driver 224) to accommodate the different reference voltage levels between controller 202 and power stage 206. High-side channel 210 can include a driver 214, device HS through to component such as a current driving circuit 230. Low-side channel 220 can include a driver 224, device LS, and other components such as current driving circuit 230. Details of current driving circuit 230 will be described in more detail below. Drivers 214, 224 can be gate drivers configured to drive devices HS, LS, through to current driving circuit 230. In one embodiment, device 200 can be a semiconductor package. In one or more embodiments, device 200 can be a combination of one or more individual semiconductor devices or packages. For example, one or more of controller 202, isolator 205, power stage 206, high-side channel 210, and low-side channel 202 can form one or more semiconductor ICs or chips.

In an aspect, high voltage devices or transistors can be referred to as devices that are wide band gap devices or super junction silicon MOSFET devices. Some examples of high voltage devices can include, but not limited to, silicon carbide junction-based field-effect transistors (SiC JFET), high voltage metal-oxide-semiconductors (HV MOS), super junction MOS (SJ MOS), silicon carbide MOS (SiC MOS), gallium nitride high electron mobility transistors (GaN HEMT). Devices with large band gap can be either depletion mode device or enhancement mode device. Hence, voltage regulators that utilize high voltage transistors as the power transistors may require relatively higher switching speeds to switch on the high voltage transistors. In some aspects, an increase in switching speed can reduce sizes of the output inductor and capacitor, thus reduce weight and cost, but high switching speed can also increase a risk of causing undesirable situations where both power transistors in the voltage regulator are switched on at the same time.

The semiconductor devices described herein can provide a drive circuit that uses a fixed gate bias voltage to drive a high voltage device, and uses a low voltage device (e.g., silicon device) to perform current control the high voltage device. The low voltage device can use current to control the high voltage device and the high voltage device can be operated as a cascade connected device where the fixed gate bias voltage allows the high voltage device to switch on and off based and change source voltage depend on drain source current. Referring to the example device 200 shown in FIG. 2, devices HS, LS can be high voltage devices, and their gates can be driven by a fixed bias voltage VB. Drivers 214, 224 can drive current driving circuit 230 in high-side channel 210 and low-side channel 220, respectively. Current driving circuit 230 can supply current to source terminal of devices HS, LS to control devices HS, LS (e.g., allowing or preventing current from flowing through devices HS, LS). By using fixed bias voltage VB to drive the gates of devices HS. LS, and current driving circuit 230 to control devices HS, LS, the source voltage of devices HS, LS is automatically decided by HS, LS drain current $I_D$ (current from HS to current driving circuit 230, and current from LS to current driving circuit 230), hence devices HS, LS are switching based on $I_D$. Since devices HS, LS gate voltage is fixed value, switching speed can be primarily controller by current $I_D$ switching speed, and devices HS, LS can increase switching speed while same output swing, and reducing ringing and instability.

Figure 3:
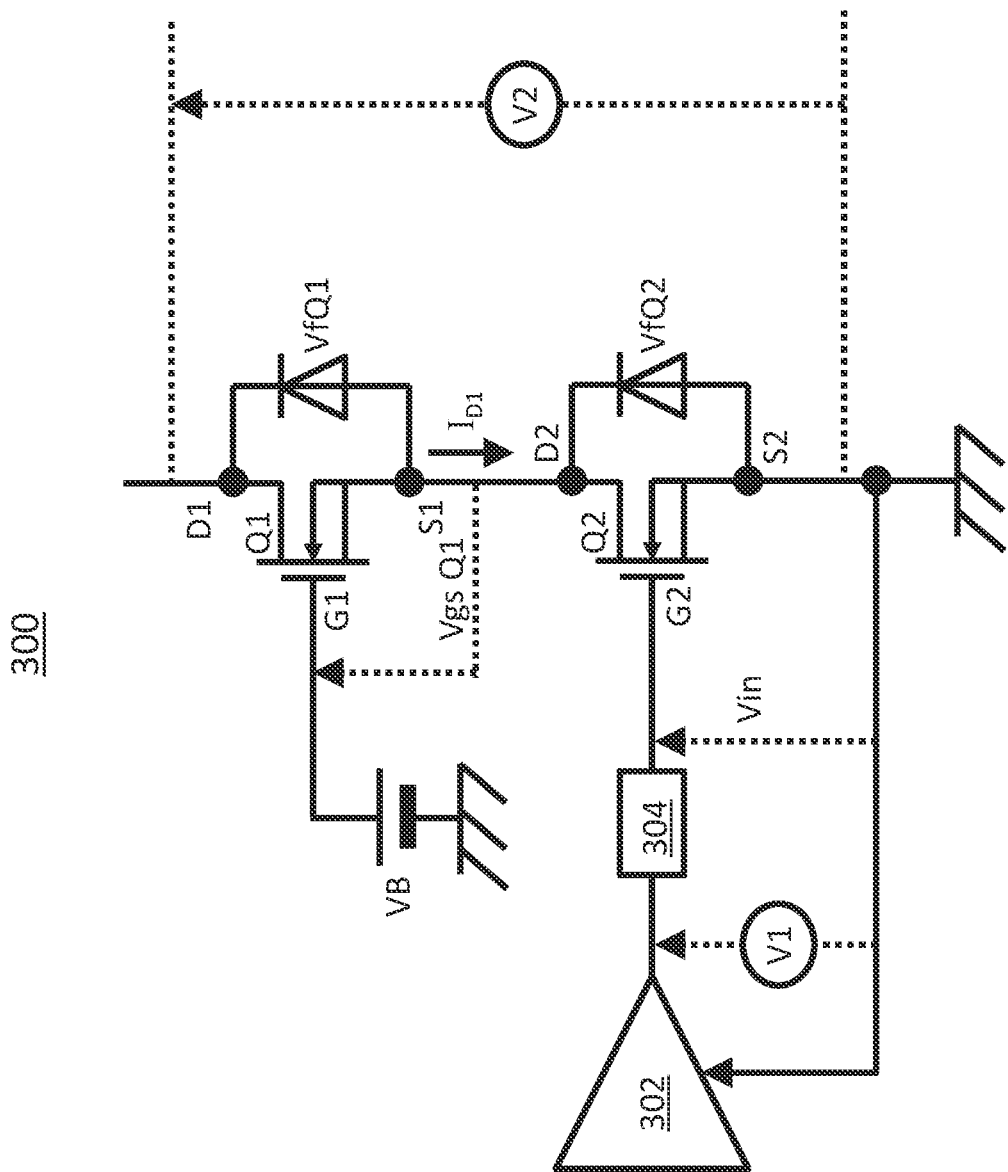
FIG. 3 is a diagram showing details of a common gate drive circuit for switching high voltage device in one embodiment.

FIG. 3 is a diagram showing details of a common gate drive circuit for switching high voltage device in one embodiment. An example circuit 300 is shown in FIG. 3. Circuit 300 can be a semiconductor device or chip implementing one of high-side channel 210 and low-side channel 220 shown in FIG. 2. Circuit 300 can include a driver 302, a device or device Q1 and a device or device Q2. Driver 302 and device Q2 can form a drive circuit, and device Q2 can be a part of current driving circuit 230 shown in FIG. 2. An output of driver 302 can be connected to a gate G2 of device Q2 via a transmission line 304. Source terminal S1 of device Q1 can be connected to drain terminal D2 of device Q2. Fixed bias voltage VB can be provided to gate G1 of device Q1 to switch device Q1 on and off. Device Q2 can have a smaller band gap, a lower breakdown voltage, and a lower ON resistance, than device Q1. In one embodiment, device Q1 can be a high voltage device, such as SiC JFET, HV MOS, SJ MOS, SiC MOS, GaN HEMT device. Device Q2 can be a low voltage device such as silicon MOSFET.

In one or more embodiments, fixed bias voltage VB can be predetermined and can be based on whether device Q1 is an enhancement mode device or a depletion mode device. Enhancement mode devices can include, for example, a transistor or a FET that is switched off at zero gate-source voltage (e.g., when Vgs is zero). Depletion mode device can be, for example, transistor or MOSFETs that are switched on at zero gate-source voltage. Hence, in response to device Q1 being an enhancement mode device. VB can be set to a nonzero fixed voltage level that can be higher than a gate threshold voltage of device Q1 and lower than a gate-source breakdown voltage (e.g., BVgs) of device Q1. In response to device Q1 being a depletion mode device, VB can set to zero. Setting the voltage level of fixed bias voltage VB based on the type of device Q1 (e.g., type being enhancement mode or depletion mode) can ensure that device Q1 switched on or off depend on whether device Q2 is switched on or off. In one embodiment, a drain-source voltage (Vds) of device Q2 can be greater than fixed bias voltage VB-Vgs.

In one embodiment, if driver 302 outputs an OFF signal to switch off device Q2, current will not be flowing between device Q1 to ground even though the fixed bias voltage VB is being supplied to the gate of device Q1. The source voltage at S1 cause gate source voltage Vgs to be less than the gate threshold voltage of Q1 (e.g., Vgs<Vth, where Vgs=VB−source voltage at S1). When driver 302 outputs an ON signal to switch on device Q2, current can flow through devices Q1 because the source voltage at S1 causes gate source voltage Vgs to be equivalent to be greater than the gate threshold voltage of Q1 (e.g., Vgs>Vth). Thus, device Q2 can function as a current driver for device Q1 and device Q1 can function as a common gate device without external bias circuit.

The addition of a low voltage device (e.g., device Q2) can occupy less circuit board space when compared to other solutions for improving drive circuits for high voltage devices. For example, since device Q2 is a low voltage device, the time and voltage required to switch on device Q2 can be lower than the time and voltage required for driver 302 to switch on a high voltage device. Therefore, drive circuit 300 can provide relatively high switching speed while using low voltage to drive a high voltage transistor.

Further, due to the cascade connection of devices Q1 and Q2, a Vgs feedback voltage measured from drain D1 (V2) of device Q2 (Vin) can be less than (e.g., approximately ⅕) the Vgs feedback voltage of conventional common source drive circuits (e.g., FIG. 1A, FIG. 1B). The lowered feedback voltage can provide power on shoot through protection, thus eliminating a need for clamp circuits that can be costly and occupy circuit board space. The lowered feedback voltage can also allow the switching speed to be adjusted (e.g., increased) in a relatively easier fashion (e.g., relatively small drive voltage is needed) since there may be no need for a negative drive voltage to increase the switching speed (whereas conventional common source drive circuits use negative drive voltage). In one embodiment, a high voltage devices such as SJ-MOS can work up to a switching speed of 100 kilohertz (kHz) when driven by conventional common source drive circuits (e.g., FIG. 1A, FIG. 1B), but this switching speed can improve up to 500 kHz when using circuit 300.

In an aspect, device Q2 can function with relatively low drain-source voltage (Vds), such as less than 20V. This low Vds can allow a drain current of device Q2 to be measured relatively easily using, for example, drain-source on resistance (e.g., $R_{DSon}$ or resistance of device Q2 when device Q2 is switched on) or a current sense MOSFET (e.g., sense voltage is relatively smaller thus easier to detect). Hence, the drain current can be measured on a cycle-by-cycle basis and can be used as a feedback for overcurrent protection and/or to control and adjust deadtime, effectively adjusting a switching speed of driver 302. Gate-source voltage Vgs of device Q2 can also be monitored for deadtime control and adjustment on a cycle-by-cycle basis. In one embodiment, the resistance $R_{DSon}$ of device Q2 can be less than $R_{DSon}$ of device Q1.

If an inductive load (e.g., load 204 in FIG. 1A) is connected to an output of circuit 100, the inductive load can generate recirculation current and the body diode of device LS can function as a reverse current path. In FIG. 1A where device LS is a SiC MOS, the PN junction body diode can have relatively large forwarding voltage (e.g., diode loss) and this large forwarding recirculation current can negatively impact a reliability of the high voltage device. In FIG. 3 the cascade connection of device Q1 and device Q2 can counter the impact of device Q1's large forwarding voltage because the $R_{DSon}$ of device Q1 will be present due to device Q1 being switched on by fixed bias voltage VB−VfQ2=Vgs Q1>Vth Q1. A product of the $R_{DSon}$ of device Q1 and the reverse current through device Q1's body diode can be less than the body diode forwarding voltage of device Q1, hence no current may flow through device Q1's body diode.

Figure 4:
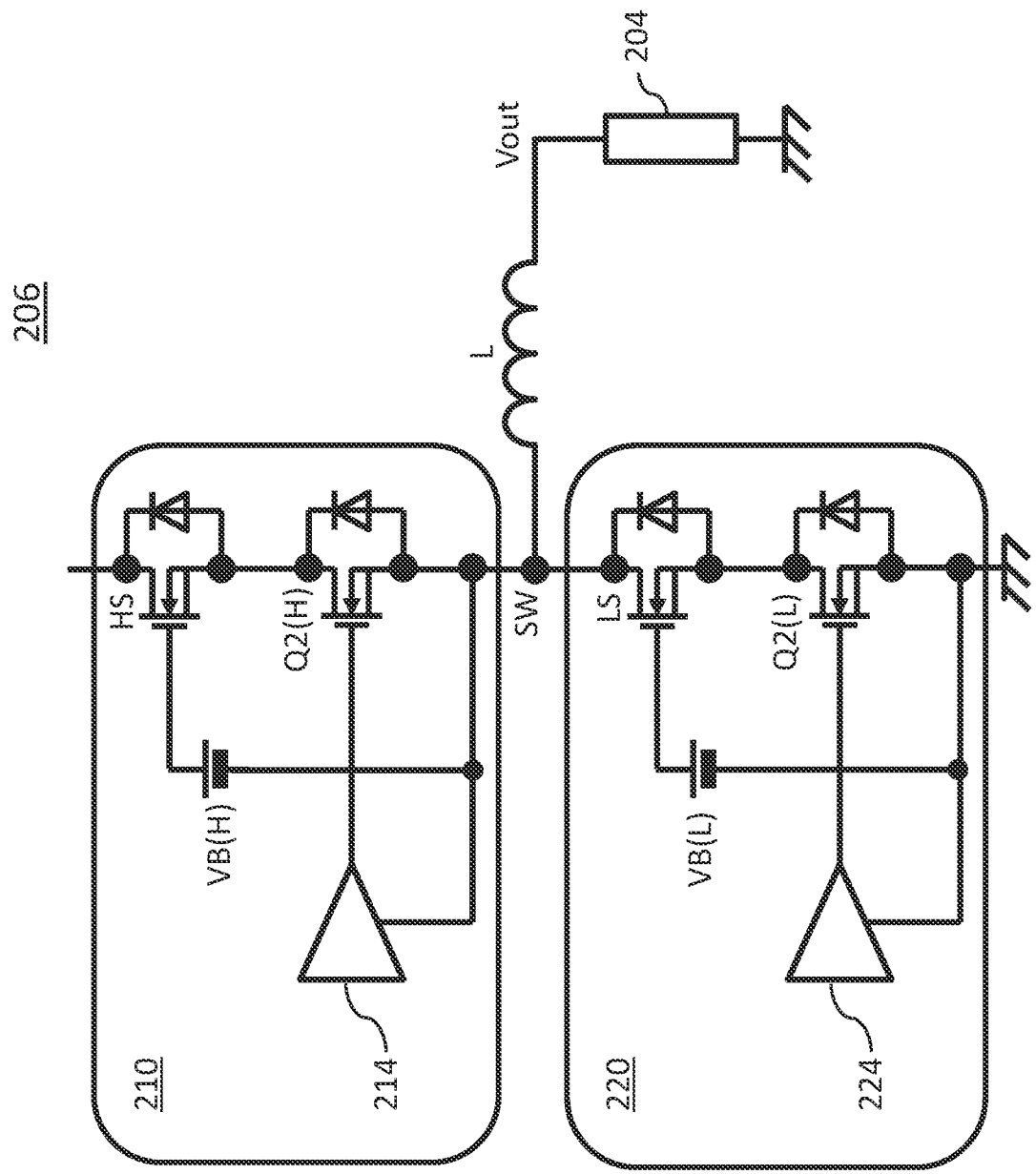
FIG. 4 is a diagram showing a device that can implement more than one common gate drive circuits for switching high voltage devices in one embodiment.

FIG. 4 is a diagram showing a device that can implement more than one common gate drive circuits for switching high voltage devices in one embodiment. An implementation of power stage 206 (also shown in FIG. 2) using two copies of drive circuit 300 of FIG. 3 is shown in FIG. 4. High-side channel 210 can include driver 214, device HS, and a device Q2(H). Referring to FIG. 2, device Q2(H) shown in FIG. 4 can be implemented as device Q2 of drive circuit 300 and device HS can be implemented as device Q1 of drive circuit 300. Low-side channel 220 can include driver 224, device LS, and a device Q2(L). Referring to FIG. 3, device Q2(L) shown in FIG. 4 can be implemented as device Q2 of drive circuit 300 and device LS can be implemented as device Q1 of drive circuit 300.

An output of driver 214 can be connected to a gate of device Q2(H). A source terminal of device HS can be connected to drain terminal of device Q2(H). Fixed bias voltage VB(H) can be provided to the gate of device HS to switch device HS on and off. An output of driver 224 can be connected to a gate of device Q2(L). A source terminal of device LS can be connected to drain terminal of device Q2(L). Fixed bias voltage VB(L) can be provided to the gate of device LS to switch device LS on and off. Fixed bias voltage VB(H) and VB(L) can have the same voltage level.

Device Q2(H) can have a smaller band gap and a lower gate threshold voltage than device HS. Device HS can be a high voltage device, such as SiC JFET, HV MOS, SJ MOS, SiC MOS, GaN HEMT device. Device Q2(H) can be a low voltage device such as silicon MOSFET. Device Q2(L) can have a smaller band gap and a lower gate threshold voltage than device LS. Device LS can be a high voltage device, such as SiC JFET, HV MOS, SJ MOS, SiC MOS, GaN HEMT device. Device Q2(L) can be a low voltage device such as silicon MOSFET.

In one or more embodiments, fixed bias voltage VB(H) can be predetermined and can be based on whether device HS is an enhancement mode device or a depletion mode device. In response to device HS being an enhancement mode device, VB(H) can be set to a nonzero fixed voltage level that can be higher than a gate threshold voltage of device HS and lower than a gate-source breakdown voltage of device HS. In response to device HS being a depletion mode device, VB(H) can set to zero.

Fixed bias voltage VB(L) can be predetermined and can be based on whether device LS is an enhancement mode device or a depletion mode device. In response to device LS being an enhancement mode device, VB(L) can be set to a nonzero fixed voltage level that can be higher than a gate threshold voltage of device LS and lower than a gate-source breakdown voltage of device LS. In response to device LS being a depletion mode device, VB(L) can set to zero.

In one embodiment, to operate power stage 206, device Q2(H) and device Q2(L) can be switched on alternately. When device Q2(H) is switched on, device Q2(L) is switched off, and current can flow from Vin to load 304 via device HS, device Q2(H), and inductor L. When device Q2(H) is switched off, device Q2(L) is switched on, and inductor L recirculation current can flow from load 204 to ground, to device Q2(L) (ON), and device LS (ON) to SW node.

In one embodiment, regardless of whether device Q2(H) and device Q2(L) are switched on or off, VB(H) and VB(L) can remain constant or fixed such that devices HS, LS can follow off or on depend on current driver Q2(H) and Q2(L). Therefore, when device Q2(H) is switched on and device Q2(L) is switched off, devices HS can be switched on and device LS should be off. Current will flow from Vcc to HS (ON) to Q2(H) (ON) through inductor L to Load 204. When device Q2(H) is switched off and device Q2(L) is switched on, devices HS should be switched off and device LS can be on. The Inductor L recirculation current will continuously flow out from Inductor to load 204 to GND. Then the current flows from GND to Q2(L) (ON state) Source to Drain then LS devices HS (ON state) Source to Drain and return back to Inductor L.

Since device Q2(H) and device Q2(L) are low voltage devices, the time and voltage required to switch device Q2(H) and device Q2(L) on and off can relatively fast. Further, by maintaining VB(H) and VB(L) at constant voltage levels to keep devices HS. LS gate as low impedance to shield HS, LS drain voltage to couple Q2(H) and Q2(L) gate voltage and reduced switching node SW ringing and instability.

Figure 5:
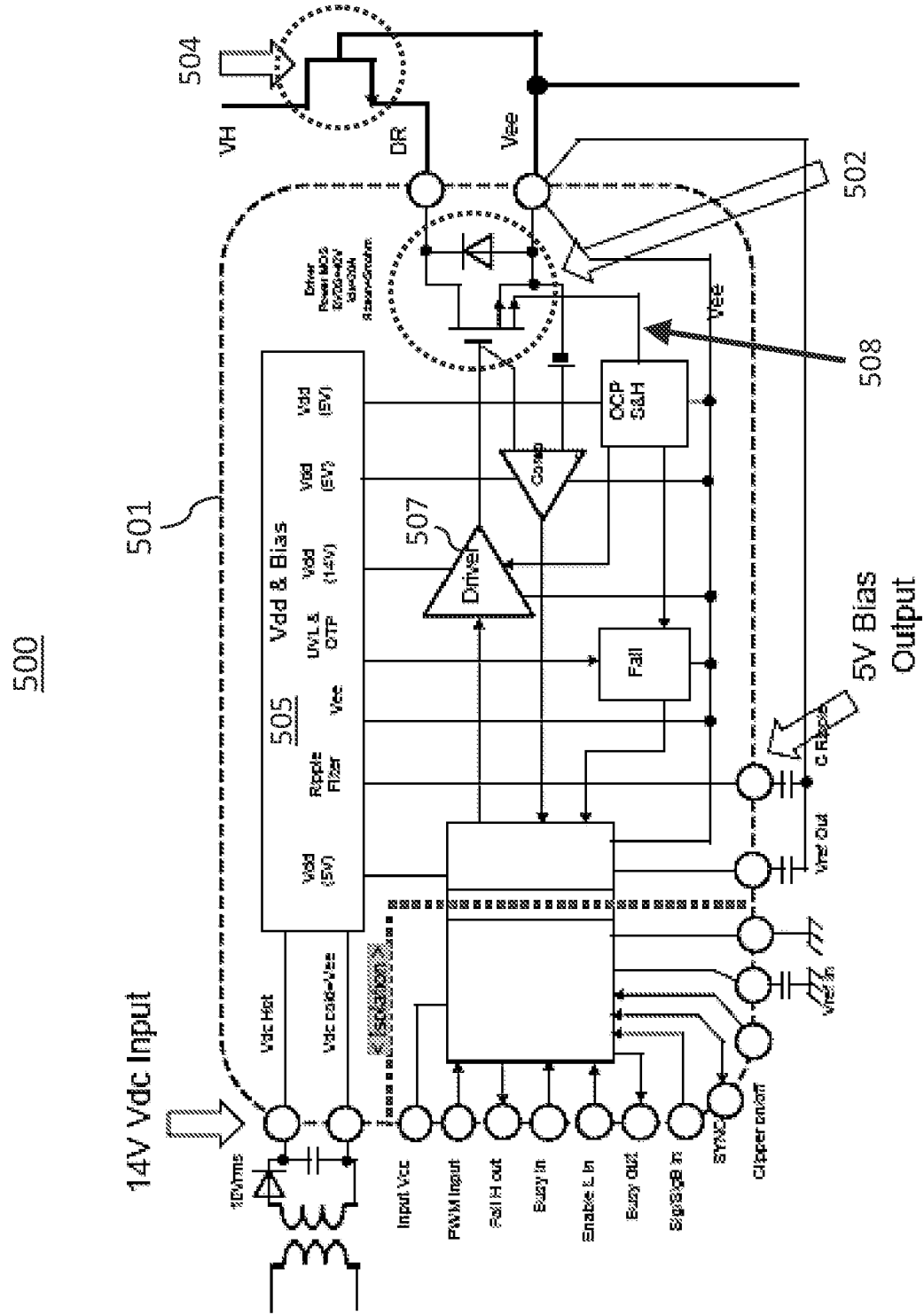
FIG. 5 is a diagram showing an application of a common gate drive circuit for switching high voltage device in one embodiment.

FIG. 5 is a diagram showing an application of a common gate drive circuit for switching high voltage device in one embodiment. A channel 500 is shown in FIG. 5, where channel 500 can be high side channel 210 in FIG. 2 or low side channel in FIG. 2. Channel 500 can include a driver IC 501 and a high voltage device 504 for this case SiC JFET. Driver IC 501 can be a semiconductor package integrating at least a voltage source circuit block 505, a driver 507, and a low voltage device 502. Driver 507 can be configured to drive low voltage device 502 and to control current being outputted from a drain terminal of low voltage device 502. The current output from low voltage device 502 can control high voltage device 504. In one embodiment, drive circuit 501 can be drive circuit 300 shown in FIG. 3. Low voltage device 502 can be device Q2 shown in FIG. 3 or device Q2(H), device Q2(L) shown in FIG. 4. High voltage device 504 can be device Q1 shown in FIG. 3 or devices Q1(H), device Q1(L) shown in FIG. 4. A driver in drive circuit 501 can drive a gate of low voltage device 502 to switch low voltage device on or off.

A fixed voltage Vee (e.g., VB in FIG. 2, FIG. 3) can drive a gate of high voltage device 504 to switch on high voltage device 504. High voltage device 504 can remain switched on due to the fixed voltage Vee. In one embodiment, voltage source circuit block 505 can be configured to convert an input voltage Vdc (e.g., 14V) into more than one predetermined fixed bias voltages. Voltage source circuit block 505 can be programmed to output one of the different fixed bias voltages based on high voltage device 504. If high voltage device 504 requires 14V to be switched on, then voltage source circuit block 505 can be programmed to output the 14V. If high voltage device 504 requires 5V to be switched on, then voltage source circuit block 505 can be programmed to output the 5V. By having voltage source circuit block 505 configured to provide different fixed bias voltages, driver IC 501 can be implemented for different types of high voltage devices or transistors.

Further, an ON current of low voltage device 502 (e.g., current when low voltage device 502 is switched on) can be monitored from a drain of low voltage device 502 using a current feedback path 508. The monitored ON current can be used by driver IC 501 to protect HV device 504 from over power stress to make hiccup operation driving by driver 507 when need.

Figure 6B:
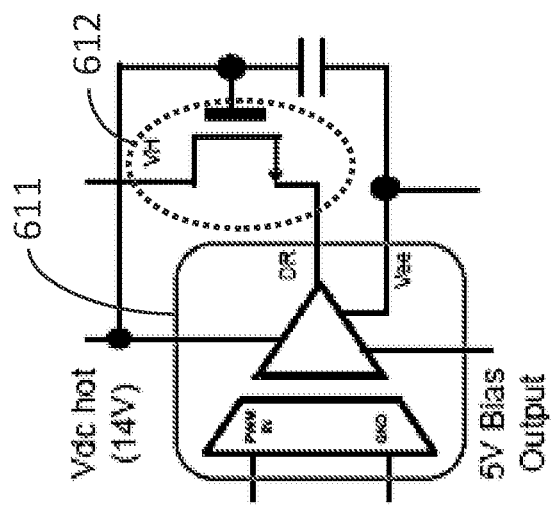
FIG. 6B is a diagram showing another example application of a common gate drive circuit for switching high voltage device in one embodiment.
Figure 6A:
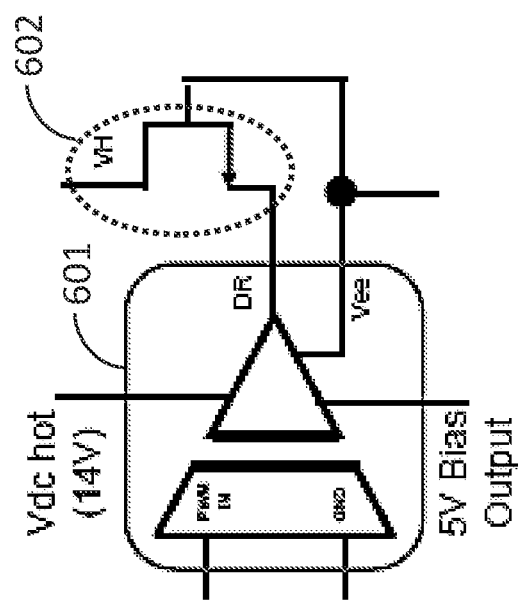
FIG. 6A is a diagram showing an example application of a common gate drive circuit for switching high voltage device in one embodiment.

FIG. 6A is a diagram showing an example application of a common gate drive circuit for switching high voltage device in one embodiment. A drive circuit 601 can include a low voltage device (e.g., device Q2 shown in FIG. 3, device Q2(H), device Q2(L) shown in FIG. 4, or low voltage device shown in FIG. 5). Drive circuit 601 can be configured to drive the low voltage device to control current flowing through a high voltage device 602. In one embodiment, drive circuit 601 can be drive circuit 300 shown in FIG. 3, and high voltage device 602 can be device Q1 shown in FIG. 3, devices Q1(H), device Q1(L) shown in FIG. 4, or high voltage device 504 shown in FIG. 5. In the embodiment shown in FIG. 6A, high voltage device 602 can be a depletion mode device, such as a SiC JFET (e.g., SiC FET that is a junction-based normally-on transistor) or a group of GaN HEMT device. The fixed voltage Vee (e.g., VB in FIG. 2, FIG. 3) can drive a gate of high voltage device 602 to switch on and off. Since high voltage device 602 is a depletion mode device, the source voltage of 602 becomes close Vee voltage, the device 602 is on. The source voltage of 602 driven by driver IC output becomes high than −Vth, the 602 is off.

FIG. 6B is a diagram showing another example application of a common gate drive circuit for switching high voltage device in one embodiment. A drive circuit 611 can include a low voltage device (e.g., device Q2 shown in FIG. 3, device Q2(H), device Q2(L) shown in FIG. 4, or low voltage device shown in FIG. 5). Drive circuit 611 can be configured to drive the low voltage device to control current flowing through a high voltage device 612. In one embodiment, drive circuit 611 can be drive circuit 300 shown in FIG. 3, and high voltage device 612 can be device Q1 shown in FIG. 3, device Q1(H), device Q1(L) shown in FIG. 4, or high voltage device 504 shown in FIG. 5. In the embodiment shown in FIG. 6B, high voltage device 612 can be an enhancement mode device, such as a SJ-MOS, HV MOS, SiC MOS devices. The fixed voltage Vee (e.g., VB in FIG. 2. FIG. 3) can drive a gate of high voltage device 612 to switch on high voltage device 612. Since high voltage device 612 is an enhancement mode device, the gate voltage of high voltage device 612 can be pulled up to a voltage source Vdc hot. (e.g., Vdchot>Vee+Vth (VH)) When driver output voltage becomes close Vee, the Vgs (VH) becomes higher than Vth(VH), means VH 612 is on. When driver output voltage becomes Vdchot, the Vgs(VH) becomes lower than Vth(VH), means VH 612 is off.

Figure 6C:
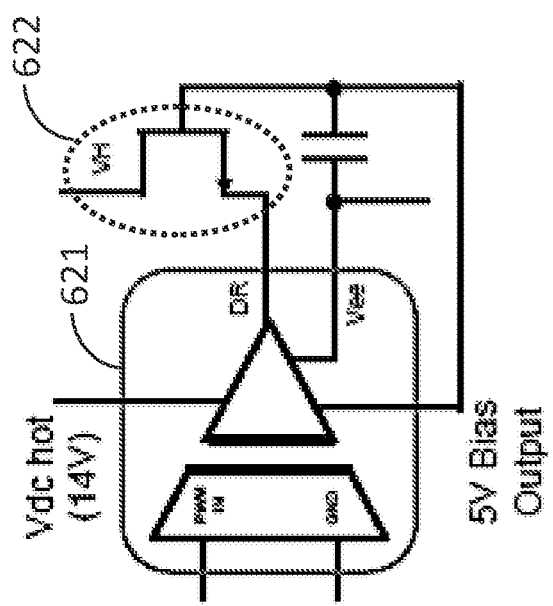
FIG. 6C is a diagram showing another example application of a common gate drive circuit for switching high voltage device in one embodiment.

FIG. 6C is a diagram showing another example application of a common gate drive circuit for switching high voltage device in one embodiment. A drive circuit 621 can include a low voltage device (e.g., device Q2 shown in FIG. 3, device Q2(H), device Q2(L) shown in FIG. 4, or low voltage device shown in FIG. 5). Drive circuit 621 can be configured to drive the low voltage device to control current flowing through a high voltage device 622. In one embodiment, drive circuit 621 can be drive circuit 300 shown in FIG. 3, and high voltage device 622 can be device Q1 shown in FIG. 3, device Q1(H), device Q1(L) shown in FIG. 4, or high voltage device 504 shown in FIG. 5. In the embodiment shown in FIG. 6C, high voltage device 622 can be an enhancement mode GaN HEMT device. The fixed voltage is 5V Bias Output (e.g., VB in FIG. 2, FIG. 3) can drive a VH 622 gate to higher than Vth(VH) but must lower than BVgs of GaN HEMT. The 5V bias is selected to meet these requirements. The on/off operation is same as explanation of FIG. 6B enhancement device.

Figure 7:
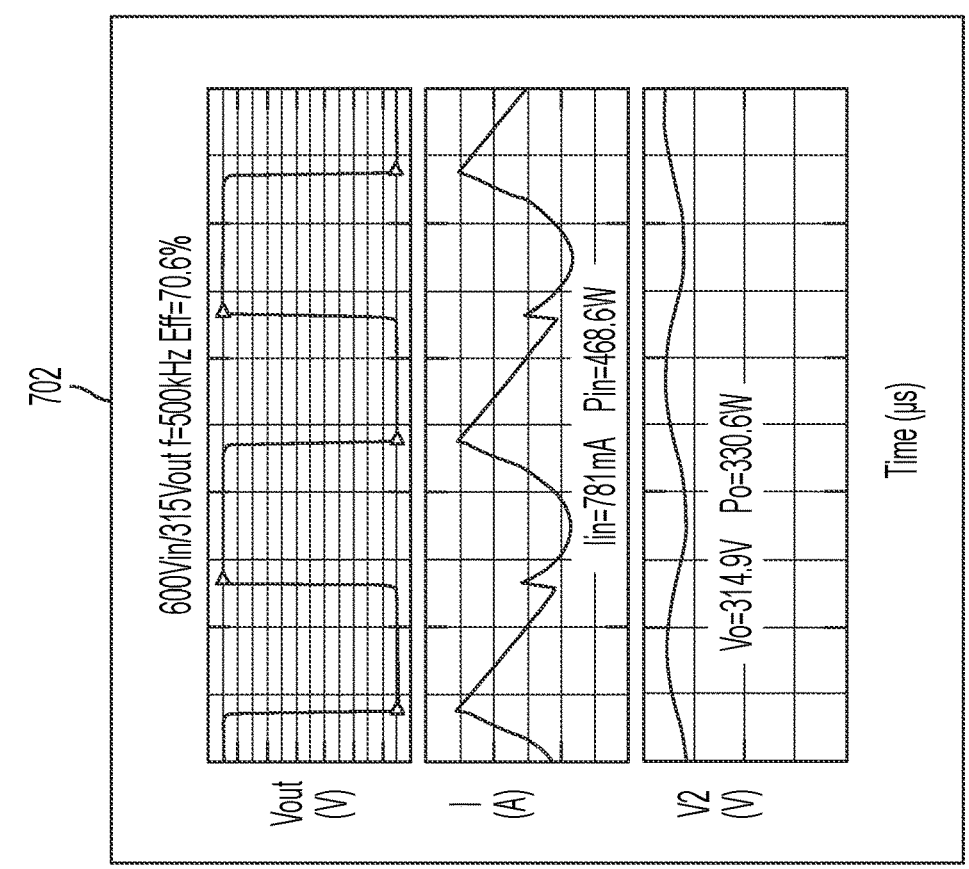
FIG. 7 is a diagram showing a comparison of waveforms between conventional drive circuits and a common gate drive circuit for switching high voltage device in one embodiment.
Figure 7:
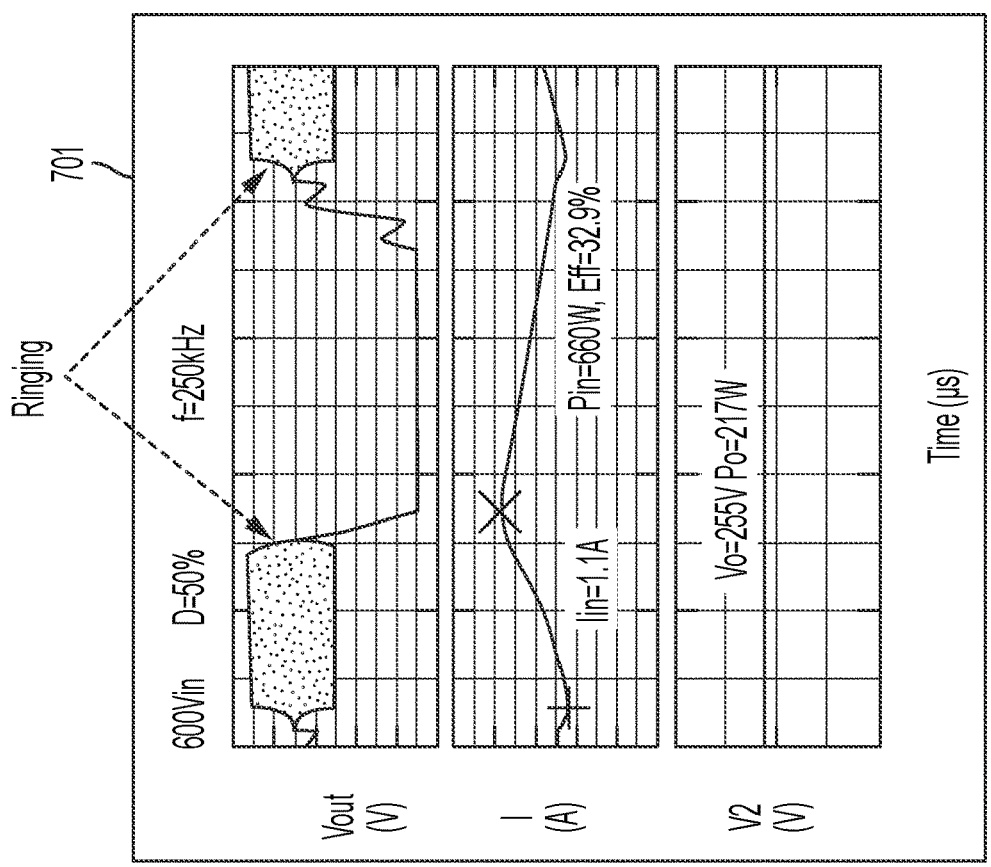

FIG. 7 is a diagram showing a comparison of waveforms between conventional drive circuits and a common gate drive circuit for switching high voltage device in one embodiment. In FIG. 7, waveforms 701 are waveforms resulting from operations of a conventional common source drive circuit (e.g., FIG. 1A, FIG. 1B). Waveforms 702 are waveforms resulting from operations of a common gate drive circuit, such as the drive circuits shown in FIG. 2 to FIG. 5. Waveforms 701 show that using the conventional common source drive circuit can cause ringing in the output voltage Vout, whereas in waveforms 702, the ringing is no longer present. Further, waveforms 701, 702 reflect operations within the same time interval. Hence, as shown in waveforms 702, the common gate drive circuit provides faster switching since there are approximately two cycles of switching, whereas waveforms 701 shows approximately one cycle of switching.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
   a voltage source configured to provide a fixed bias voltage to a first device implemented as a common gate device;
   a second device connected in series with the first device, wherein a current output of the second device is connected to a source terminal of the first device; and
   a driver configured to;
      sense an ON current of the second device; and
      drive the second device to perform current control on the first device.

2. The semiconductor device of claim 1, wherein the fixed bias voltage is greater than a gate threshold voltage of the first device and less than a gate-source breakdown voltage of the first device.

3. The semiconductor device of claim 1, wherein:
   a drain-source breakdown voltage of the second device is greater than the fixed bias voltage; and
   a drain-source on resistance of the second device is less than a drain-source on resistance of the first device.

4. The semiconductor device of claim 1, wherein the second device is a silicon metal-oxide-semiconductor field-effect-transistor (Si MOSFET).

5. The semiconductor device of claim 1, wherein the first device is one of:
   a silicon carbide junction-based field-effect transistor (SiC JFET);
   a high voltage metal-oxide-semiconductor (HV MOS) device;
   a super junction MOS (SJ MOS) device;
   a silicon carbide MOS (SiC MOS) device; and
   a gallium nitride high electron mobility transistor (GaN HEMT).

6. The semiconductor device of claim 1, wherein the voltage source is further configured to output more than one different values of the fixed bias voltage.

7. The semiconductor device of claim 1, wherein:
   the fixed bias voltage is a nonzero value in response to the first device being an enhancement mode device; and
   the fixed bias voltage is zero in response to the first device being a depletion mode device.

8. A semiconductor device comprising:
   a first device that operates as a common gate device; and a driver integrated circuit (IC) comprising:
   a voltage source configured to provide a fixed bias voltage to the first device,
   a second device connected in series with the first device, wherein a current output of the second device is connected to a source terminal of the first device; and
a driver configured to;
   sense an ON current of the second device; and
   drive the second device to perform current control on the first device.

9. The semiconductor device of claim 8, wherein the fixed bias voltage is greater than a gate threshold voltage of the first device and less than a gate-source breakdown voltage of the first device.

10. The semiconductor device of claim 8, wherein:
a drain-source breakdown voltage of the second device is greater than the fixed bias voltage; and
a drain-source on resistance of the second device is less than a drain-source on resistance of the first device.

11. The semiconductor device of claim 8, wherein the second device is a silicon metal-oxide-semiconductor field-effect-transistor (Si MOSFET).

12. The semiconductor device of claim 8, wherein the first device is one of:
- a silicon carbide junction-based field-effect transistor (SiC JFET);
- a high voltage metal-oxide-semiconductor (HV MOS) device;
- a super junction MOS (SJ MOS) device;
- a silicon carbide MOS (SiC MOS) device; and
- a gallium nitride high electron mobility transistor (GaN HEMT).

13. The semiconductor device of claim 8, wherein the voltage source is further configured to output more than one different values of the fixed bias voltage.

14. The semiconductor device of claim 8, wherein:
the fixed bias voltage is a nonzero value in response to the first device being an enhancement mode device; and
the fixed bias voltage is zero in response to the first device being a depletion mode device.

15. An apparatus comprising:
a controller configured to output a pulse width modulation (PWM) signal; and
a power converter comprising:
   a first device that operates as a common gate device;
   a driver integrated circuit (IC) comprising:
      a voltage source configured to provide a fixed bias voltage to the first device; and
      a second device connected in series with the first device, wherein a current output of the second device is connected to a source terminal of the first device; and
a driver configured to;
   sense an ON current of the second device; and
   use the PWM signal to drive the second device to perform current control on the first device.

16. The apparatus of claim 15, wherein the second device is a silicon metal-oxide-semiconductor field-effect-transistor (Si MOSFET).

17. The apparatus of claim 15, wherein the first device is one of:
- a silicon carbide junction-based field-effect transistor (SiC JFET);
- a high voltage metal-oxide-semiconductor (HV MOS) device;
- a super junction MOS (SJ MOS) device;
- a silicon carbide MOS (SiC MOS) device; and
- a gallium nitride high electron mobility transistor (GaN HEMT).

18. The apparatus of claim 15, wherein:
a drain-source breakdown voltage of the second device is greater than the fixed bias voltage; and
a drain-source on resistance of the second device is less than a drain-source on resistance of the first device.

\* \* \* \* \*